(12) United States Patent
Hernandez-Distancia et al.

(10) Patent No.: US 8,884,675 B2
(45) Date of Patent: Nov. 11, 2014

(54) APPARATUS AND METHOD FOR SLEW RATE CONTROL

(71) Applicant: Continental Automotive Systems, Inc., Auburn Hills, MI (US)

(72) Inventors: Mauricio Hernandez-Distancia, Rochester Hills, MI (US); Eugene Tavares, Rochester, MI (US); Wail Younan, Sterling Heights, MI (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 0 days.

(21) Appl. No.: 14/104,670

(22) Filed: Dec. 12, 2013

(65) Prior Publication Data

US 2014/0167827 A1    Jun. 19, 2014

Related U.S. Application Data

(60) Provisional application No. 61/737,855, filed on Dec. 17, 2012.

(51) Int. Cl.
*H03K 5/12*    (2006.01)
*H03K 6/04*    (2006.01)

(52) U.S. Cl.
CPC .................... *H03K 6/04* (2013.01)
USPC ............ 327/170; 327/108; 327/172

(58) Field of Classification Search
CPC .............. H03K 19/00361; H03K 19/00384; H03K 7/08; H03K 3/284; H03K 5/01; H03K 5/04; H03K 5/05; H03K 5/06; H03K 5/07
USPC ......... 327/170, 172–176, 108–112, 427, 434, 327/437; 326/82, 83, 21, 26–29
See application file for complete search history.

(56) References Cited

U.S. PATENT DOCUMENTS

| 6,172,541 | B1* | 1/2001 | Young et al. .................. 327/170 |
| 6,903,589 | B2* | 6/2005 | Kim .............................. 327/170 |
| 7,598,772 | B2* | 10/2009 | Young ............................ 326/83 |
| 8,013,648 | B1* | 9/2011 | Lin et al. ....................... 327/170 |
| 2013/0009671 | A1* | 1/2013 | Suzuki et al. ................. 327/108 |

\* cited by examiner

*Primary Examiner* — Lincoln Donovan
*Assistant Examiner* — Thomas Skibinski

(57) ABSTRACT

The slew rate of a transistor is controlled. Upon a transition of a MOSFET control signal, an operating voltage of the MOSFET is measured and a determination of whether the voltage is between a predetermined set of values is made. Based upon the determination, a counter is incremented, and the count of the counter corresponding slew rate. The turn-on current of the MOSFET is controlled based upon the count.

7 Claims, 3 Drawing Sheets

US 8,884,675 B2

APPARATUS AND METHOD FOR SLEW RATE CONTROL

CROSS REFERENCE TO RELATED APPLICATION

This patent claims benefit under 35 U.S.C. §119(e) to U.S. Provisional application No. 61/737,855, filed Dec. 17, 2012 and entitled "Hi or Lo side MOSFET driver control," the contents of which are incorporated herein by reference in their entirety.

TECHNICAL FIELD

This application relates to signal shaping, and more specifically to controlling the slew rate of signals used in various types of systems.

BACKGROUND OF THE INVENTION

Various types of transistors are used in control systems. For example, Metal Oxide Semi-conductor Field Effect (MOSFET) transistors are used in many control systems. In one example, a microprocessor may create the control signal and that control signal is used to control the MOSFET transistor.

Different operating parameters define the performance of MOSFET transistors. One of these parameters is the "slew rate" of the control signals that are used to control the MOSFET. The slew rate refers to the maximum voltage change allowed per unit time. If the slew rate is not controlled, negative effects can occur with respect to system operation. The higher the slew rate, the faster the signal transitions from one value to another.

MOSFETs can be used to control pulse width modulation (PWM) processes where the pulse width changes (is modulated) based upon input provided by the MOSFET. However, if the slew rate of the signal created by the MOSFET varies (due to a variety of factors such as MOSFET component variation, layout variation, temperature variation, and battery voltage) the PWM function will be inaccurate and a system might not perform in a satisfactory manner.

Present control approaches preset the slew rate to some preset value. Unfortunately, this means that variations of slew rate cannot be accounted for by the system. This has led to sub-optimal performance in some systems and some user dissatisfaction with previous approaches.

BRIEF DESCRIPTION OF THE DRAWINGS

For a more complete understanding of the disclosure, reference should be made to the following detailed description and accompanying drawings wherein.

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

Approaches are provided that vary the slew rate of a control signal that is used to drive or otherwise a control a MOSFET transistor. Although the approaches described herein are applicable specifically to MOSFET transistors, they may be used to control the slew rate of control signals that are applied to various types of transistors.

In many of these embodiments, a slew rate control approach is provided. In some aspects, at each MOSFET, during turn-on and turn-off cycles, the drain-to-source voltage ($V_{DS}$) rise and fall times of the MOSFET is measured and the MOSFET gate turn-on and turn-off currents are adjusted accordingly in the next cycle to achieve a desired slew rate. Slew rates can therefore be changed according to varying conditions. Greater flexibility in alternate MOSFET sourcing is provided. Great PWM accuracy can be achieved. More predictable and consistent performance may be achieved for the MOSFET (and the system where the MOSFET is used) over a given and over the entire operating range. In other words, the present approaches takes into account system, temperature, and process variations to provide a variable and changeable slew rate for a control signal applied to a transistor.

In others of these embodiments, the slew rate of a transistor is controlled. Upon a transition of a MOSFET control signal, an operating voltage of the MOSFET is measured and a determination of whether the voltage is between a predetermined set of values is made. Based upon the determination, a counter is incremented, and the count of the counter corresponding slew rate. The turn-on current of the MOSFET is controlled based upon the count.

Figure 1:
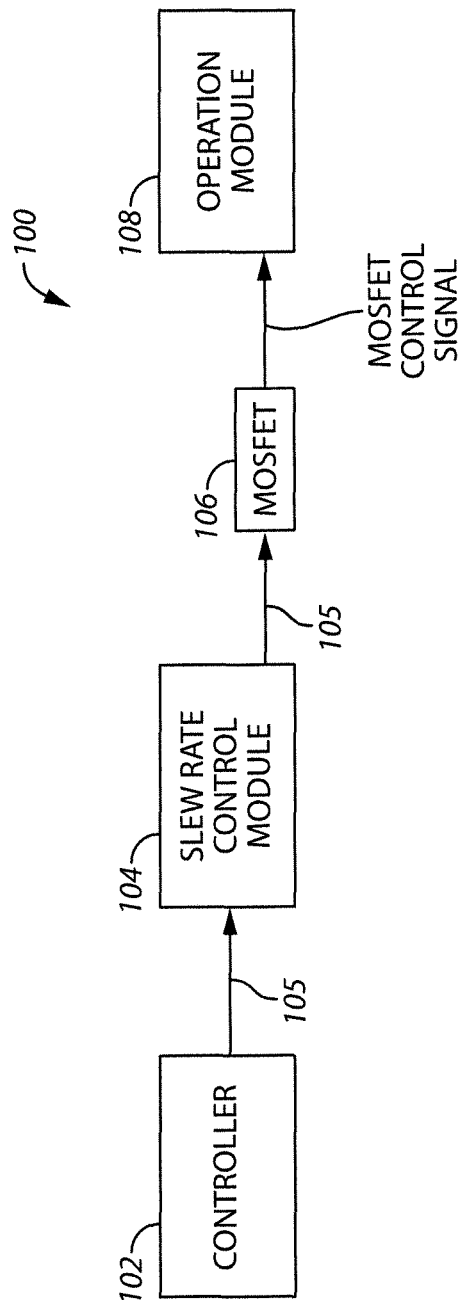
FIG. 1 comprises a block diagram of a system that uses slew rate control according to various embodiments of the present invention.

Referring now to FIG. 1, a system 100 that provides for slew rate control is described. The system 100 includes a controller 102, a slew rate control module 104, a MOSFET 106, and an operation module 108.

The controller 102 produces a control signal 105 that is transmitted to the slew rate control module 104. The controller 102, in one example, may be a microprocessor. The controller 102 may be part of (and be a controller for) a fuel pump, a motor, or a fuel injector to mention a few examples. Other examples are possible.

The control signal 105 controls operation of the MOSFET 106. As described below, the slew rate control module 104 (during turn-on and turn-off cycles) measures voltages of the MOSFET 106 (e.g., drain to source voltages). Based upon these voltages, the turn-on and/or turn off current applied to the gate of the MOSFET 106) are adjusted. This adjusts the slew rate of the control signal that controls the MOSFET 106.

The MOSFET 106 is activated or de-activated by the control signal 105. This controls the operation of the operation module 108, which for example, may control be valves or solenoids to mention two examples. In one aspect, the operation module 108 performs a PWM function that is controlled by the MOSFET 106. Other types of transistors may also be used.

Figure 2:
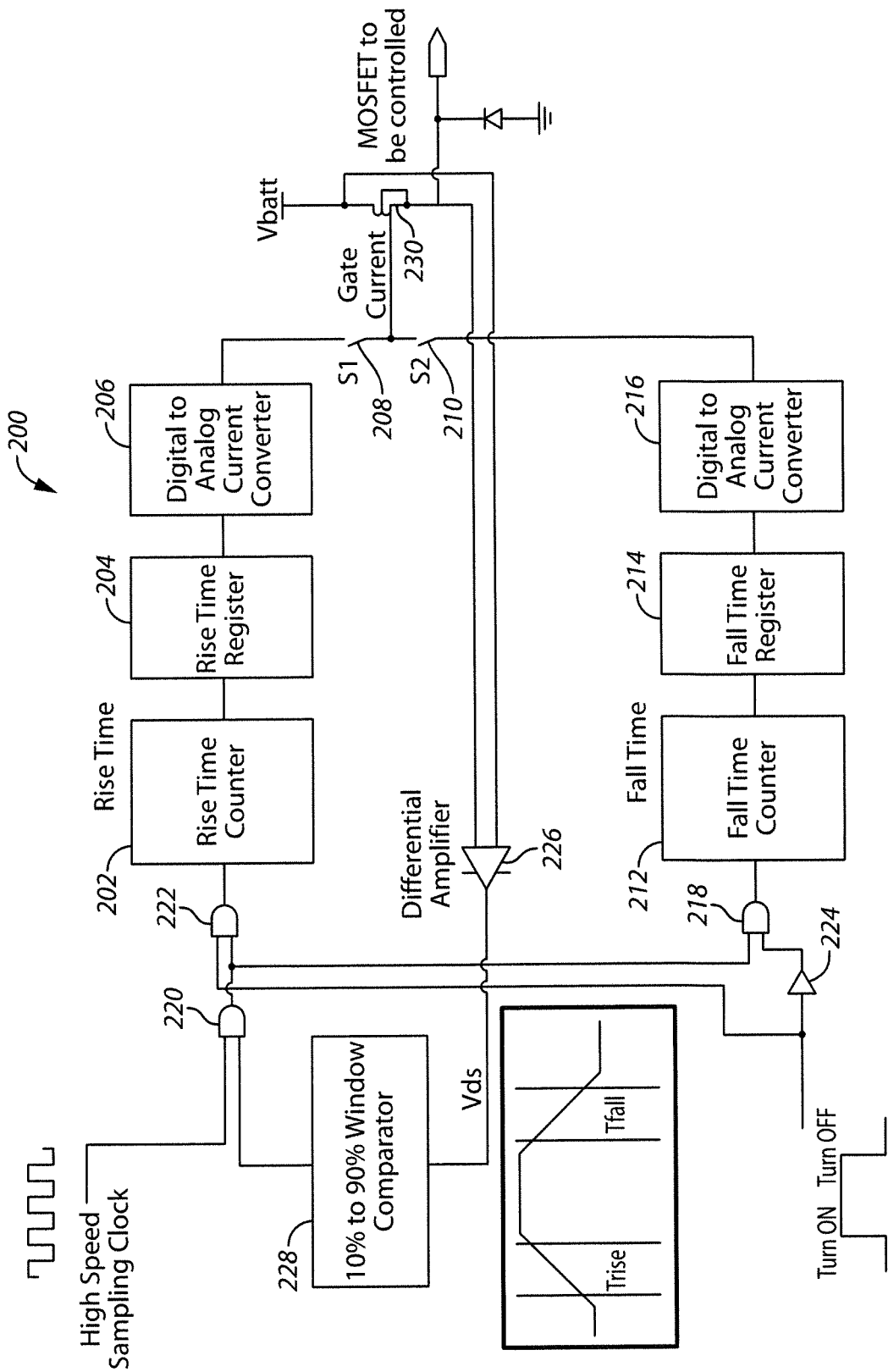
FIG. 2 comprises a block diagram of a slew rate control approach, apparatus, or module according to various embodiments of the present invention.

Referring now to FIG. 2, one example of a slew rate control module 200 is described. The slew rate control module 200 includes a rise time counter 202, a rise time register 204, a digital-to-analog converter 206, a first switch (S1) 208, a second switch (S2) 210, a fall time counter 212, a fall time register 214, a second digital-to-analog converter 216, a first AND gate 218, a second AND gate 220, a third AND gate 222, an inverter 224 a differential amplifier 226, and a window comparator 228. A MOSFET 230 is controlled by the module 200.

It will be appreciated that the first AND gate 218, second AND gate 220, third AND gate 222, inverter 224, and differential amplifier 226 are used for gating, timing, and/or driving purposes as known to those skilled in the art and their functions will not be described further herein. Moreover, other combinations of these or other elements can be used to perform these functions.

In operation, every time the MOSFET control signal transitions from a low to a high value, the drain to source voltage (Vds) voltage of the MOSFET 230 is measured during rise time. This voltage is fed to the window comparator 228. The window comparator 228 is configured so that its output will be at a level "high" when the MOSFET Vds voltage is between 10% and 90%. Other percentages may also be used.

The output of the window comparator 228 enables the rise time counter 202, which is clocked by a high frequency clock signal. The counting will stop when the output of the window comparator 228 becomes "low". The result (count) of the rise time counter 202 is a measure of the rise time slew rate, When the MOSFET control signal transitions from high to low, the value (count) of the rise time counter 202 is loaded into the rise time register 204 that is connected to the first digital-to-analog converter 206 (e.g., for current). The converter 206 generates the proper MOSFET Gate turn-on current based on the number (count) recorded in the rise time register. When the MOSFET control signal transitions from low to high again, the first switch (S1) 208 closes and the MOSFET Gate turn-on current will control the new MOSFET rise time. During this time the MOSFET Vds voltage is measured again to correct the MOSFET rise time slew rate for next cycle.

Every time the MOSFET control signal transitions from low to high the rise time counter 202 will reset to "0" waiting for the output of the window comparator 228 to start the count.

Every time the MOSFET control signal transitions from high to low, the MOSFET Vds voltage is measured during fall time; this voltage is fed to the window comparator 228 above that is designed so that the output will be at level "High" when the MOSFET Vds voltage is between 10% and 90%. Other examples are possible. The output of the window comparator 228 will enable that fall time counter 212 that is clocked by the same high frequency clock signal above. The counting will stop when the output of window comparator 228 becomes "Low". The count or result of the fall time counter 212 is a measure of the fall time slew rate.

When the MOSFET Control signal transitions from Low to High, the value (count) of the fall time counter 212 is loaded to the fall time register 214 that is connected to the second digital-to-analog converter 216 (e.g., for current) that will generate the proper MOSFET gate turn-off current based on the number recorded in the fall time register 212. When the MOSFET control signal transitions from High to Low again, the second switch 210 (S2) closes and the MOSFET Gate turn-off current will control the new MOSFET fall time. During this time the MOSFET Vds voltage is measured again to correct the MOSFET fall time slew rate for next cycle.

Every time the MOSFET Control signal transitions from high to low the fall time counter 212 will reset to "0" waiting for the output of the window comparator 228 to start the count.

Although one particular slew rate control module is shown, it will be appreciated that other types of circuitry and other combinations of circuitry can be used. In other words, the approaches described with respect to FIG. 2 are examples only and other examples are possible.

Figure 3:
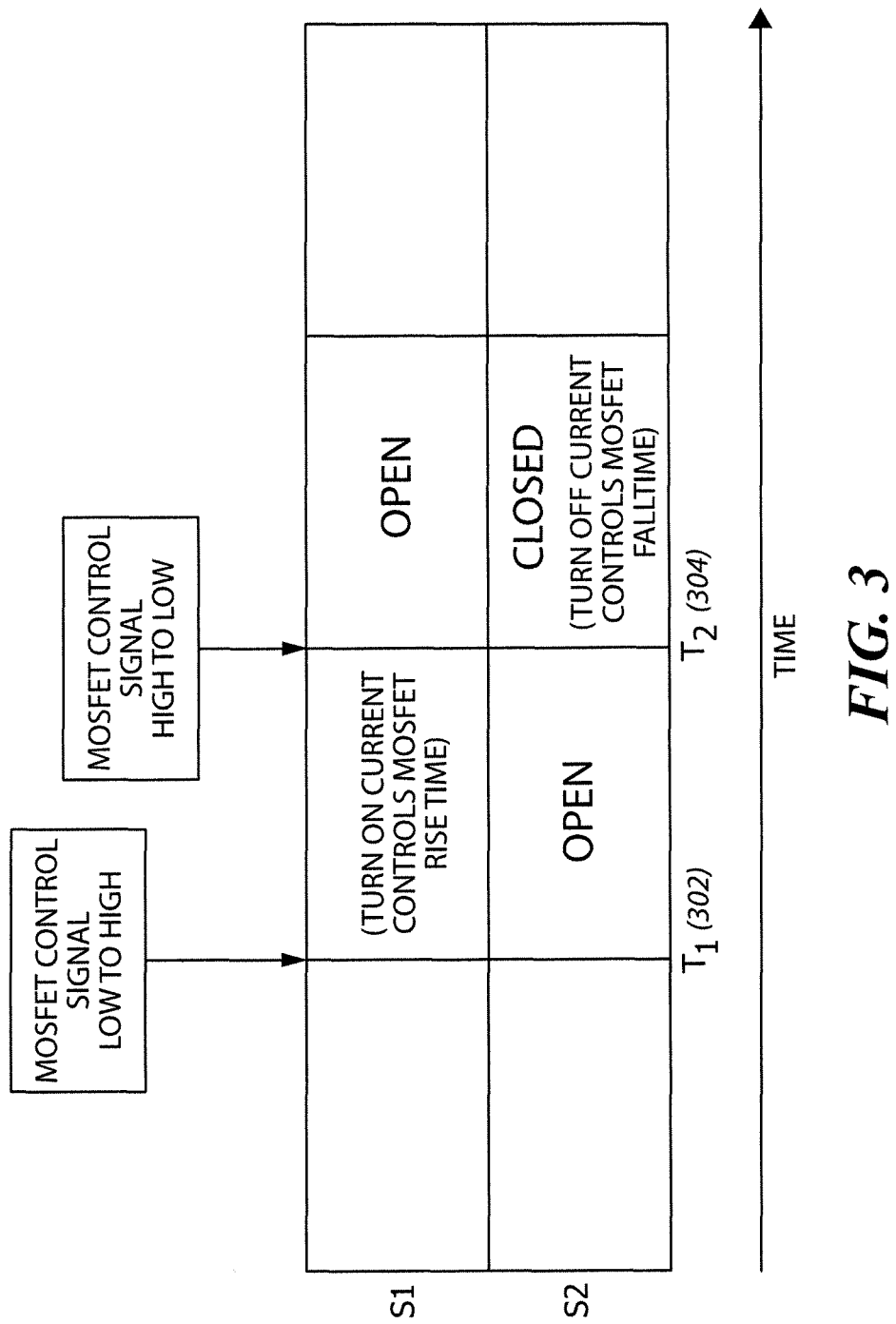
FIG. 3 comprises a timing diagram of the operator of the system of FIG. 2 according to various embodiments of the present invention.

Referring now to FIG. 3, operation of the switches 208 (S1) and 210 (S2) of FIG. 2 are described. At time 302, the MOSFET control signal transitions from low to high. This action closes the switch S1 and the turn-on current will control the operation of the MOSFET.

At time 304, the MOSFET control signal transitions from high to low. This opens S1 but closes S2. Closing S2 turns off the current. This controls the new MOSFET fall time for the MOSFET. It will be appreciated that when one of S1 or S2 is open, the other of S1 and S2 is closed. Also, in some examples the switches S1 and S2 can be omitted for instance when control involving only the rise time is desired.

Preferred embodiments of this invention are described herein, including the best mode known to the inventors for carrying out the invention. It should be understood that the illustrated embodiments are exemplary only, and should not be taken as limiting the scope of the invention.

What is claimed is:

1. A method of controlling a slew rate of a transistor, comprising:
    upon a first transition of a MOSFET control signal from a low to a high value, measuring an operating voltage of a MOSFET and determining whether the operating voltage is between a first predetermined set of values, and when the operating voltage is between the first predetermined set of values incrementing a first counter, a first count of the first counter corresponding to a rise time slew rate of the MOSFET control signal;
    controlling a turn-on current of the MOSFET based upon the first count;
    subsequently upon a second transition of a MOSFET control signal from a high to a low value, measuring the operating voltage of the MOSFET, and determining whether the operating voltage is between a second predetermined set of values, and when the operating voltage is within the second predetermined set of values incrementing a second counter, a second count of the second counter corresponding to a fall time slew rate of the MOSFET control signal;
    controlling a turn-off current of the MOSFET based upon the second count.

2. The method of claim 1 wherein the operating voltage is a drain-to-source voltage of the MOSFET.

3. The method of claim 1 wherein the predetermined first and second set of values is between 10% and 90% of a full range value.

4. An apparatus for controlling the slew rate of a transistor, the apparatus comprising:
    a receiver apparatus for receiving a MOSFET control signal from a controller;
    a window comparator apparatus coupled to the receiver apparatus, the window comparator apparatus configured to, upon a transition of a MOSFET control signal, measure an operating voltage of a MOSFET and determining whether the voltage is between a first predetermined set of values when the operating voltage transitions from a low to a high, and determining whether the voltage is between a second predetermined set of values when the operating voltage transitions from a high to a low;
    a first counter apparatus, the first counter apparatus coupled to the window comparator apparatus, the first counter apparatus configured to, based upon an output of the window comparator apparatus, increment a first count when the window comparator apparatus detects that the voltage is between the first predetermined set of values and is rising, the first count corresponding to a rise time slew rate of the MOSFET control signal;

such that a turn-on current of the MOSFET is controlled based upon the first count;

a second counter apparatus, the second counter apparatus coupled to the window computer apparatus, the second counter apparatus configured to, based upon an output of the window comparator apparatus, increment a second count when the operating voltage is between the second predetermined set of values and is falling, the second count corresponding to a fall time slew rate of the MOSFET control signal;

such that a turn-off current of the MOSFET is controlled based upon the second count.

5. The apparatus of claim 4 wherein the operating voltage is a drain-to-source voltage of the MOSFET.

6. The apparatus of claim 4 wherein the predetermined set of values is between 10% and 90% of a full range value.

7. The apparatus of claim 4, further comprising a first switch and a second switch, wherein the switches are coupled to the MOSFET allowing current to flow therethough when closed, and wherein actuation of one of the first switch and the second switch is controlled by the transitioning of the MOSFET control signal.

* * * * *